(12) United States Patent
Chou et al.

(10) Patent No.: US 8,033,011 B2
(45) Date of Patent: Oct. 11, 2011

(54) METHOD FOR MOUNTING A THINNED SEMICONDUCTOR WAFER ON A CARRIER SUBSTRATE

(75) Inventors: Jason Chou, Tao Yuan Shien (TW); Chang-Hwang Hua, Tao Yuan Shien (TW); Ping-Wei Chen, Tao Yuan Shien (TW); Sen Yang, Tao Yuan Shien (TW)

(73) Assignee: Win Semiconductors Corp., Tao Yuan Shien (TW)

( * ) Notice: Subject to any disclaimer, the term of this patent is extended or adjusted under 35 U.S.C. 154(b) by 602 days.

(21) Appl. No.: 12/222,343

(22) Filed: Aug. 7, 2008

(65) Prior Publication Data

US 2010/0035405 A1    Feb. 11, 2010

(51) Int. Cl.
*H01L 21/70* (2006.01)

(52) U.S. Cl. ............ 29/830; 29/832; 438/412; 438/455; 257/507

(58) Field of Classification Search ............ 29/830–835; 438/106–125, 455–459, 460–464; 257/507–509
See application file for complete search history.

(56) References Cited

U.S. PATENT DOCUMENTS

| | | | |
|---|---|---|---|
| 5,620,928 A * | 4/1997 | Lee et al. ...................... | 438/118 |
| 6,093,623 A * | 7/2000 | Forbes ......................... | 438/455 |
| 6,309,950 B1 * | 10/2001 | Forbes ......................... | 438/455 |
| 6,572,944 B1 * | 6/2003 | Glenn et al. .................. | 428/40.1 |
| 6,610,167 B1 * | 8/2003 | Glenn et al. ................. | 156/272.2 |
| 7,071,032 B2 * | 7/2006 | Hsu et al. ...................... | 438/113 |
| 7,112,518 B2 * | 9/2006 | Liu ................................ | 438/487 |
| 7,115,981 B2 * | 10/2006 | Grigg ............................ | 257/684 |
| 7,189,593 B2 * | 3/2007 | Lee ............................... | 438/107 |
| 7,226,812 B2 * | 6/2007 | Lu et al. ........................ | 438/114 |
| 2004/0023470 A1 * | 2/2004 | Hsu et al. ...................... | 438/460 |
| 2004/0219713 A1 * | 11/2004 | Lee ............................... | 438/106 |
| 2005/0215078 A1 * | 9/2005 | Liu et al. ...................... | 438/795 |
| 2008/0073774 A1 * | 3/2008 | Yang et al. .................... | 257/698 |
| 2008/0315376 A1 * | 12/2008 | Tang et al. .................... | 257/660 |
| 2009/0072357 A1 * | 3/2009 | Tang et al. .................... | 257/659 |
| 2010/0006988 A1 * | 1/2010 | Tang et al. .................... | 257/659 |

* cited by examiner

*Primary Examiner* — Derris Banks
*Assistant Examiner* — Kaying Kue
(74) *Attorney, Agent, or Firm* — Bacon & Thomas, PLLC

(57) ABSTRACT

A method for mounting a thinned semiconductor wafer on a carrier substrate for further processing is disclosed. The method consists of a series of steps, which is based on providing a frame with a double-side tape to mount the thinned wafer on the carrier substrate. The frame is used to support the double-side tape and can be designed to fit the conventional production line for holding, picking and transferring wafers. The carrier substrate can be a sapphire substrate, a quartz substrate or other substrates that can sustain further processing, such as thermal treatments and/or chemical etchings. The method of the present invention not only prevents possible damages to the highly brittle chip after wafer thinning, but also fits the conventional production line for processing semiconductor wafers.

6 Claims, 4 Drawing Sheets ized, or even cracked during further processing steps for front side devices. Therefore, it is necessary to develop a method for handling thinned wafer, which can sustain further processing, such as thermal treatments and/or chemical etchings.

METHOD FOR MOUNTING A THINNED SEMICONDUCTOR WAFER ON A CARRIER SUBSTRATE

FIELD OF THE INVENTION

The present invention relates to a method for III-V semiconductor wafer processing, and more particularly, relates to a method for mounting a thinned semiconductor wafer on a carrier substrate for further processing. The method not only prevents possible damages during the handling of thinned wafers for further processing, but also fits the conventional production line. Further, the method is particularly useful for handling wafers after back-side processing, such as back-side via-hole etching and metal coating for the fabrication of semiconductor power devices, and can also be applied to the production line for other areas that requires handing of thinned wafers, such as light emitting diodes, micro-electro-mechanical systems (MEMS), and solar cells.

BACKGROUND OF THE INVENTION

The state-of-the-art III-V semiconductor power devices, such as pHEMT (pseudomorphic high-electron mobility transistor) devices or HBT (Heterojunction Bipolar Transistor) devices, require not only sophisticated fabrication processes on the front-side of a semiconductor wafer, but also back-side wafer processing, such as via-hole etching and metal coating.

For back-side via-hole processing, the wafer has to be thinned to a desired thickness, which is typically less than 100 μm. An important step in back-side processing of GaAs wafers for power devices is the deposition of metal layer on the back-side surface and into through substrate via holes in order to meet thermal conduction requirements and provide low inductance ground connections. During the back-side wafer processing steps, the wafers front-sides were mounted onto flat carriers. To prevent possible damages to the front-side devices, the fabricated devices must be carefully protected or passivated. However, the processing steps will be further complicated if the front-side wafer requires bumping processes. Typical bumping processes will lead to a surface topological difference of about 50-100 μm. If the front-side bumping processes were proceeded before wafer thinning for back-side processing, it becomes very difficult to protect the surface bumps of such a large topological difference when attaching the wafer front side to the carrier substrate.

A possible approach is to perform back-side wafer processing steps prior to the surface bumping processes. However, the major technical challenge is that the wafer will become highly brittle after wafer thinning. Wafers were usually damaged, or even cracked during further processing steps for front side devices. Therefore, it is necessary to develop a method for handling thinned wafer, which can sustain further processing, such as thermal treatments and/or chemical etchings.

SUMMARY OF THE INVENTION

The main object of the present invention is to develop a method that can handle thinned semiconductor wafers for further processing. The method consists of a series of steps, which is based on providing a frame with a double-side tape to mount the thinned wafer on a carrier substrate. The frame is used to support the double-side tape and can be designed to fit the conventional production line for holding, picking and transferring wafers. The carrier substrate can be a sapphire substrate, a quartz substrate or other substrates that can sustain further processing, such as thermal treatments and/or chemical etchings.

An advantage of the present invention is that it prevents possible damages to the highly brittle chip after wafer thinning, which is particularly useful during the fabrication of many semiconductor devices, such as power devices, light emitting diodes, micro-electro-mechanical systems (MEMS), as well as solar cells.

Another advantage of the invented method is that it can be designed to fit the conventional production lines for processing semiconductor wafers even without using the metal frame as long as the mounting thinned wafers follow the same or a similar way.

DETAILED DESCRIPTION OF PREFERRED EMBODIMENTS

All the process steps for mounting a thinned wafer on a carrier substrate are based on providing a frame with a double-side tape. The frame can be a metal frame, or a frame made of other materials that can be used to support the double-side tape thereon. The metal frame can also be designed to fit the conventional production line for processing wafers. Therefore, the invented process steps are not only helpful for mounting thinned wafer on carrier substrate manually, but also beneficial for handling thinned wafer under the frame work of high-volume production lines.

Figure 1:
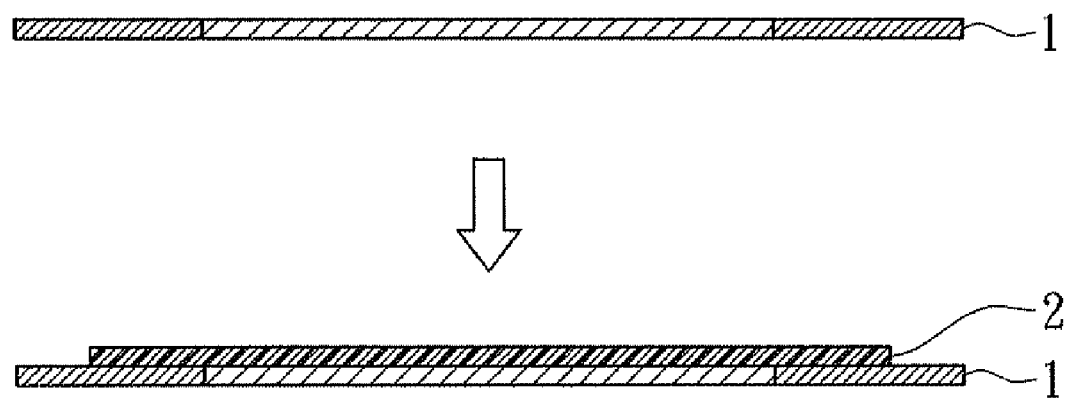
FIG. 1 depicts schematically the first step for thin wafer mounting of the present invention.
Figure 2:
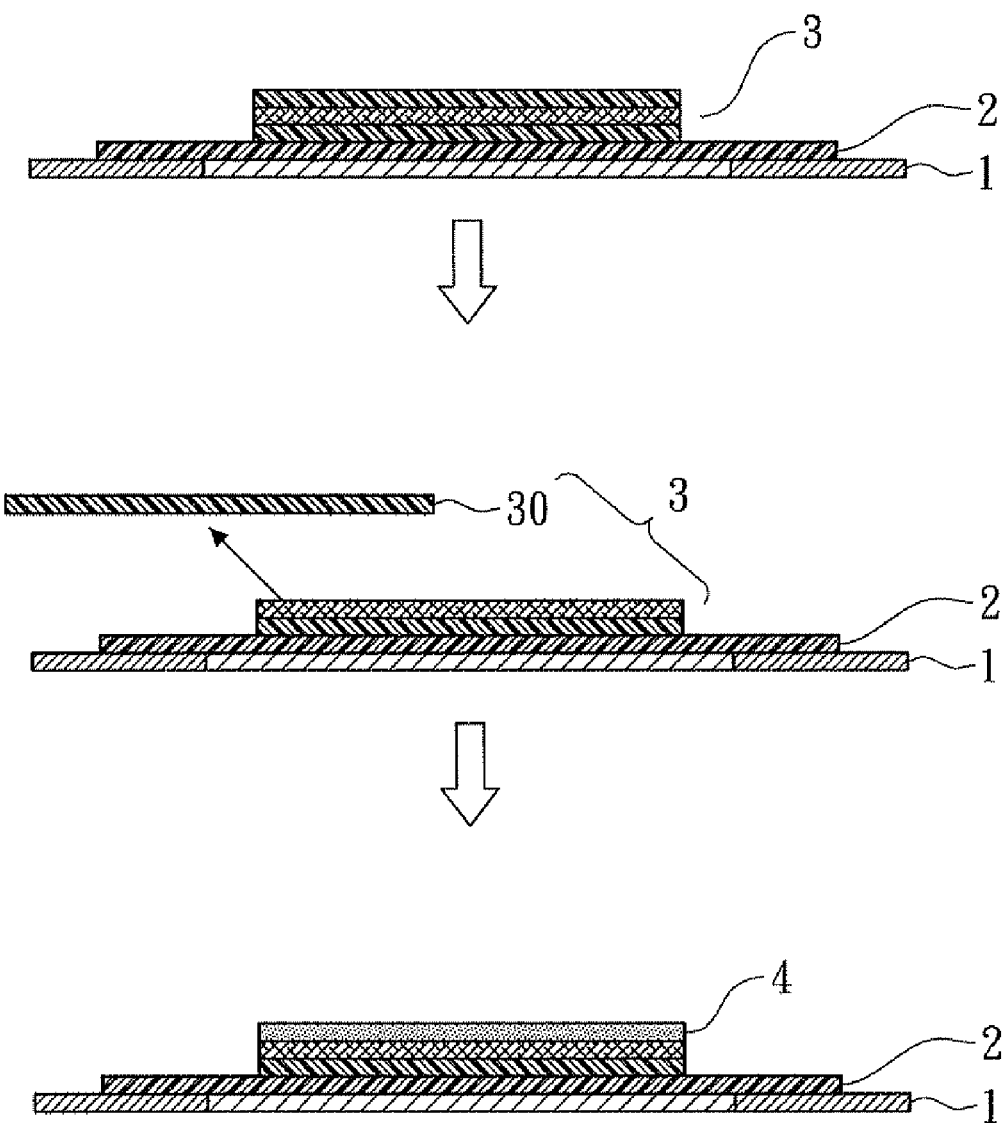
FIG. 2 depicts schematically the second step for thin wafer mounting of the present invention.
Figure 3:
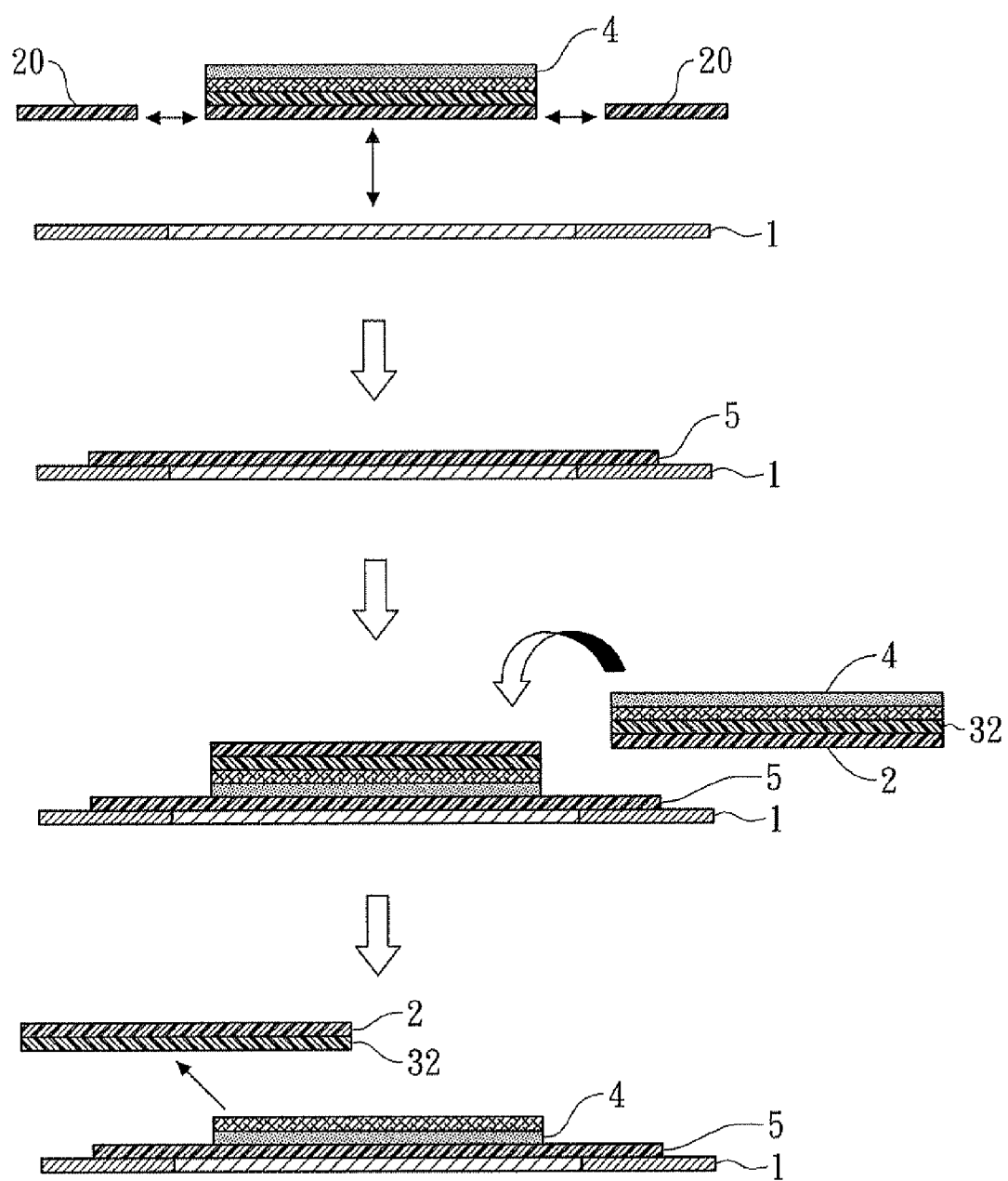
FIG. 3 depicts schematically the third step for thin wafer mounting of the present invention.
Figure 4:
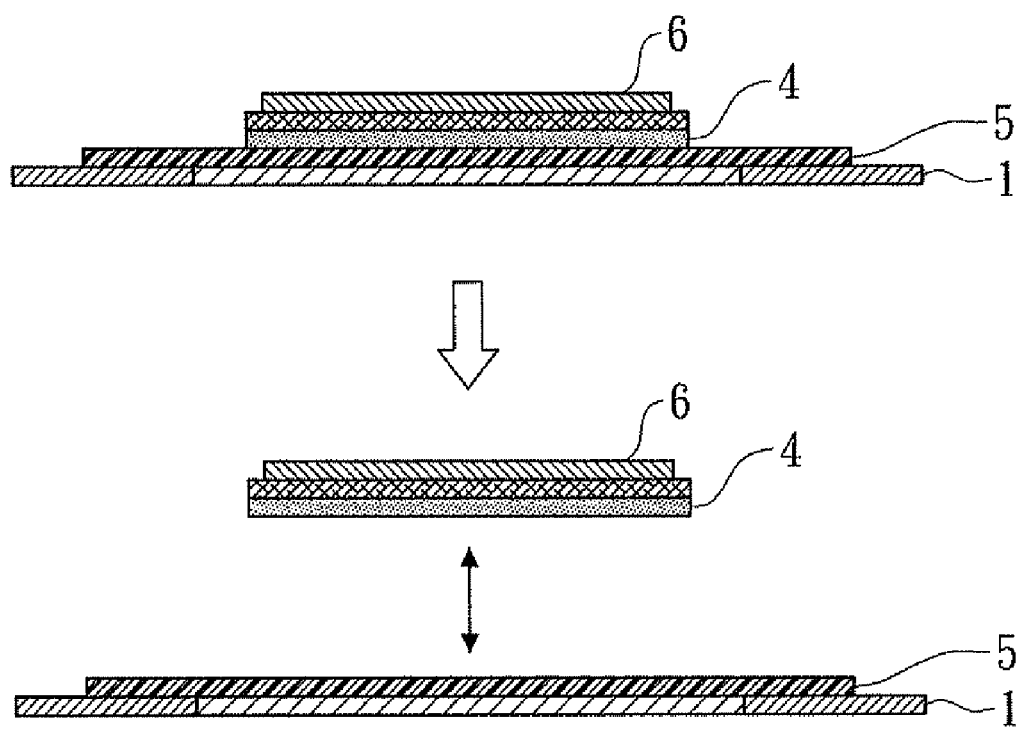
FIG. 4 depicts schematically the final step for thin wafer mounting of the present invention.

The first step of the present invention is to prepare such a frame for further processing, as illustrated in FIG. 1. In this step, a metal frame 1 is first prepared, followed by attaching a first blue tape 2 on the said metal frame. The second step of the present invention is to attach a carrier substrate to the metal frame with a double-side tape for mounting the thinned wafer, as illustrated in FIG. 2. In this step, a double-side tape 3 is laid on the first blue tape 2 that has been attached to the metal frame 1. The front cover film 30 of the double-side tape 3 is then torn off, followed by attaching the carrier substrate 4 onto the double-side tape. The carrier substrate 4 could be a sapphire substrate, a quartz substrate or other substrates that can firmly hold a thinned wafer and sustain further processing, such as thermal treatments and/or chemical etchings. The third step of the present invention is to flip the carrier substrate 4 with the double-side tape 3 on the top, in order to facilitate mounting a thinned wafer thereon, as shown in FIG. 3. In this step, the carrier substrate 4 along with both the double-side tape 3 and the first blue tapes 2 is first detached from the metal frame 1. The exterior portion 20 of blue tape may be cut away from the carrier substrate 4. In order to reattach the carrier substrate 4 to the metal frame 1, a second blue tape 5 is laid on the metal frame 1. The sapphire substrate with both the double-side tape 3 and the first blue tapes 2 is then flipped upside-down and reattached to the metal frame 1. After that, the first blue tape 2 together with the rear cover film 32 of the double-side tape 3 is removed, leaving behind a carrier substrate 4 with the double-side tape 3 thereon ready for mounting a thinned wafer 6. The final step is to mount the thinned wafer 6 to the carrier substrate 4, as shown in FIG. 4. In this step, the thinned wafer 6 is mounted firmly onto the carrier substrate 4 via the double-side tape thereon. The thinned wafer mounted on the carrier substrate can now be detached from the metal frame for further processing.

What is claimed is:

1. A method for mounting a thinned semiconductor wafer on a carrier substrate, comprising the following procedures:
    A. Providing a frame with a first blue tape thereon;
    B. Attaching the carrier substrate to the first blue tape on the frame by using a double-side tape having rear and front cover films thereon in between;
    C. Detaching the carrier substrate together with the double-side tape and the first blue tape from the frame;
    D. Laying a second blue tape onto the frame;
    E. Attaching the carrier substrate together with the double-side tape and the first blue tape to the second blue tape on the frame;
    F. Removing the first blue tape and the rear cover film of the double-side tape from the carrier substrate; and
    G. Mounting the thinned wafer onto the carrier substrate via the double-side tape and then detaching from the frame for further processes.

2. The method according to claim 1, wherein the procedure (B) further comprises steps of:
    laying the double-side tape on the first blue tape;
    tearing off the front cover film of the said double-side tape; and
    attaching the carrier substrate onto the said double-side tape.

3. The method according to claim 1, wherein the procedure (E) further comprises steps of:
    flipping the carrier substrate together with the double-side tape and the first blue tape; and
    attaching the carrier substrate to the second blue tape on the frame.

4. The method according to claim 1, wherein the procedure (E) further comprises steps of:
    Flipping the frame with the second blue tape;
    Attaching the second blue tape to the carrier substrate; and
    Flipping back the frame with the second blue tape together with the carrier substrate, the double-side tape and the first blue tape.

5. The method according to claim 4, wherein the said carrier substrate is made of materials that can firmly hold the thinned wafer and sustain further processes, such as thermal treatments and/or chemical etchings.

6. The method according to claim 5, wherein the said carrier substrate is a sapphire substrate or a quartz substrate.

* * * * *